(12) United States Patent
Dasgupta et al.

(10) Patent No.: US 10,692,839 B2
(45) Date of Patent: Jun. 23, 2020

(54) GAN DEVICES ON ENGINEERED SILICON SUBSTRATES

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Beaverton, OR (US); Peter G. Tolchinsky, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 15/574,822

(22) PCT Filed: Jun. 26, 2015

(86) PCT No.: PCT/US2015/038095
§ 371 (c)(1),
(2) Date: Nov. 16, 2017

(87) PCT Pub. No.: WO2016/209282
PCT Pub. Date: Dec. 29, 2016

(65) Prior Publication Data
US 2018/0145052 A1    May 24, 2018

(51) Int. Cl.
*H01L 21/02* (2006.01)
*H01L 25/065* (2006.01)
(Continued)

(52) U.S. Cl.
CPC ...... *H01L 25/0657* (2013.01); *H01L 21/0254* (2013.01); *H01L 21/02381* (2013.01); *H01L 21/02428* (2013.01); *H01L 21/02458* (2013.01); *H01L 21/02658* (2013.01); *H01L 21/8252* (2013.01); *H01L 21/8258* (2013.01); *H01L 21/823871* (2013.01); *H01L 23/481* (2013.01); *H01L 25/50* (2013.01); *H01L 27/0605* (2013.01); *H01L 27/0688* (2013.01); *H01L 27/085* (2013.01); *H01L 27/092* (2013.01); *H01L 29/2003* (2013.01); *H01L 29/7787* (2013.01); *H01L 2225/0652* (2013.01); *H01L 2225/06541* (2013.01); *H01L 2225/06589* (2013.01)

(58) Field of Classification Search
None
See application file for complete search history.

(56) References Cited

U.S. PATENT DOCUMENTS

2003/0030056 A1*  2/2003  Callaway, Jr. ...... H01L 21/8258
                                                                         257/76
2003/0033974 A1   2/2003  Ueda
(Continued)

OTHER PUBLICATIONS

International Preliminary Report for Patentability for International Patent Application No. PCT/US15/38095, dated Jan. 4, 2018.
(Continued)

*Primary Examiner* — Joseph C. Nicely
*Assistant Examiner* — Lamont B Koo
(74) *Attorney, Agent, or Firm* — Green, Howard & Mughal LLP

(57) ABSTRACT

GaN-On-Silicon (GOS) structures and techniques for accommodating and/or controlling stress/strain incurred during III-N growth on a large diameter silicon substrate. A back-side of a silicon substrate may be processed to adapt substrates of standardized diameters and thicknesses to GOS applications. Bowing and/or warping during high temperature epitaxial growth processes may be mitigated by pre-processing silicon substrate so as to pre-stress the substrate in a manner than counterbalances stress induced by the III-N material and/or improve a substrate's ability to absorb stress. III-N devices fabricated on an engineered GOS substrate may be integrated together with silicon MOS devices fabricated on a separate substrate. Structures employed to improve substrate resilience and/or counterbalance the substrate stress induced by the III-N material may be further employed for interconnecting the III-N and silicon MOS devices of a 3D IC.

16 Claims, 9 Drawing Sheets

(51) Int. Cl.
*H01L 27/06* (2006.01)
*H01L 27/085* (2006.01)
*H01L 21/8258* (2006.01)
*H01L 21/8238* (2006.01)
*H01L 21/8252* (2006.01)
*H01L 23/48* (2006.01)
*H01L 25/00* (2006.01)
*H01L 27/092* (2006.01)
*H01L 29/20* (2006.01)
*H01L 29/778* (2006.01)

(56) References Cited

U.S. PATENT DOCUMENTS

| | | | |
|---|---|---|---|
| 2008/0210949 A1* | 9/2008 | Makabe | ................ H01L 29/205 257/76 |
| 2010/0120202 A1 | 5/2010 | Wu et al. | |
| 2011/0140118 A1 | 6/2011 | Ramdani | |
| 2011/0140242 A1 | 6/2011 | Ramdani | |
| 2012/0007220 A1 | 1/2012 | Wu | |
| 2012/0018847 A1 | 1/2012 | Tu et al. | |
| 2012/0126240 A1 | 5/2012 | Won | |
| 2012/0132921 A1 | 5/2012 | Chen et al. | |
| 2012/0153440 A1* | 6/2012 | Ikuta | ..................... H01L 21/187 257/615 |
| 2014/0183563 A1* | 7/2014 | Nakata | ................ H01L 29/7786 257/77 |
| 2014/0295651 A1 | 10/2014 | Ramdani | |

OTHER PUBLICATIONS

International Search Report and Written Opinion for International Patent Application No. PCT/US2015/038095, dated Mar. 25, 2016.
EP Partial Supplementary Search Report dated Feb. 19, 2019 for EP Patent Application No. 15896568.1.
Extended European Search Report dated May 23, 2019 for EP Patent Application No. 15896568.1.
Office Action from European Patent Application No. 15896568.1 notified Jan. 15, 2020, 9 pgs.

* cited by examiner

US 10,692,839 B2

GAN DEVICES ON ENGINEERED SILICON SUBSTRATES

CLAIM OF PRIORITY

This Application is a National Stage Entry of, and claims priority to, PCT Application No. PCT/US15/38095, filed on 26 Jun. 2015 and titled "GAN DEVICES ON ENGINEERED SILICON SUBSTRATES", which is incorporated by reference in its entirety for all purposes.

BACKGROUND

Demand for integrated circuits (ICs) in portable electronic applications has motivated greater levels of semiconductor device integration. Many advanced semiconductor devices in development seek to leverage III-N materials that show particular promise for high voltage and high frequency applications like power management ICs and RF power amplifiers. III-N heteroepitaxial (heterostructure) field effect transistors (HFET), such as high electron mobility transistors (HEMT) and metal oxide semiconductor (MOS) HEMT, employ a semiconductor heterostructure with one or more heterojunction. GaN-based HFET devices benefit from a relatively wide bandgap (~3.4 eV), enabling higher breakdown voltages than Si-based MOSFETs, as well as high carrier mobility. The III-N material system is also useful for photonics (e.g., LEDs), photovoltaics, and sensors, one or more of which may be useful to integrate into an electronic device platform.

It is advantageous to heteroepitaxially grow III-N films onto a silicon substrate, both from a perspective substrate cost and for the potential to more closely integrate GaN-based devices with silicon-based devices. Such GaN-on-silicon (GOS) growths are difficult however because of both lattice mismatch and mismatch of the linear thermal expansion coefficient between the nitride material and silicon substrate. During a high temperature process, such as epitaxial growth, thermal expansion mismatch can cause substrate bowing and warping. Bow is a measure of vertical displacement of the substrate surface and becomes more significant as the substrate diameter increases unless the silicon substrate thickness is increased significantly to provide the greater rigidity needed to resist larger thermal mismatch stress. Silicon substrate diameters and thicknesses are standardized however with little concern for GOS applications. As a result, a high temperature GaN growth that induces a bow of around 300 µm in a 200 mm, 725 µm thick silicon substrate may induce a bow of over 650 µm in a 300 mm, 775 µm thick silicon substrate.

Because known stress-engineered buffer layers are unable to accommodate the bow induced in silicon substrates of the diameters currently employed and under development for silicon CMOS, alternate techniques and architectures capable of reducing wafer bow would be advantageous for fabricating GaN-based devices on these large diameter silicon substrates.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
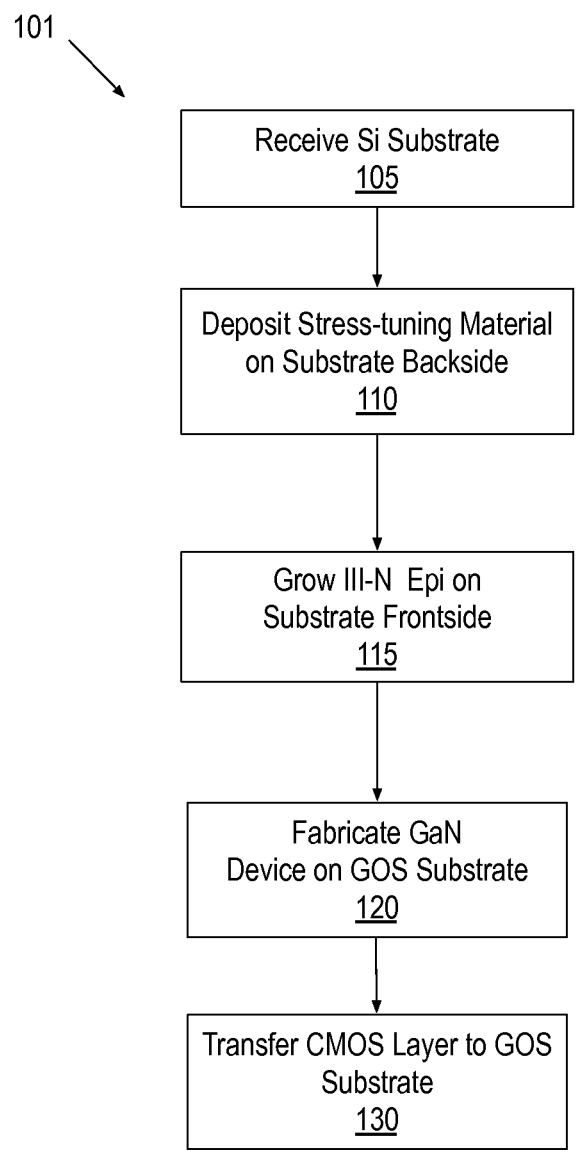
FIG. 1 is a flow diagram illustrating back-side processing of GOS substrates and integrating devices made on such substrates, in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are GOS structures and techniques for accommodating and/or controlling stress/strain incurred during III-N growth on a large diameter silicon substrate of at least 300 mm. The inventors have noted in their work that if stress-induced substrate curvature during thermal processing of mismatched materials is sufficiently large, plastic deformation in the substrate will occur by slip and/or dislocation, resulting in permanent substrate bow. Such permanent deformation can subsequently prevent proper photolithographic imaging, which for example may have depth of field limitations that require a wafer bow/flatness specification of less than +/−30 μm. Although small amounts of bow can be compensated through the use of a buffer structure disposed between a silicon substrate and the III-N device material, the inventors have determined that for substrates of diameters much beyond 200 mm, buffer layers alone are unlikely to prevent stress from exceeding the critical level leading to permanent bow.

In some embodiments therefore, bowing and/or warping during high temperature processes, such as epitaxial growth of the III-N material(s), is mitigated by pre-processing the silicon substrate with a stress-tuning material. The stress-tuning material may pre-stress the substrate to counterbalance stress induced by the III-N material and/or improve a substrate's ability to absorb stress (i.e., resilience). In some embodiments described further below, a silicon substrate having a diameter and thickness standardized for silicon CMOS applications is adapted for use in GOS applications through back-side processing. In some further embodiments, III-N devices fabricated on an engineered GOS substrate are integrated together with silicon MOS devices fabricated on a separate substrate. In one or more exemplary embodiment, structures employed to improve substrate resilience and/or counterbalance GOS substrate stress induced by the III-N material are further employed for interconnecting the III-N and silicon MOS devices of a 3D IC.

In some embodiments, a GOS substrate includes a stress-tuning material disposed on a back-side of the substrate, opposite a front-side upon which the III-N material is disposed. The stress-tuning material may pre-stress the GOS substrate so as to counter a subsequent stress induced by the III-N material that causes what is referred to herein as "in-situ" bow. In-situ bow occurs during single-sided epitaxial growth of the III-N material. In some embodiments, the stress-tuning material induces a mitigating stress that reduces strain experienced by the GOS substrate to a level below a threshold associated with plastic deformation of silicon. The stress-tuning material may thereby ensure that a GOS substrate returns from the in-situ bowed state to a sufficiently flat state when at a temperature employed for patterning of device layers on the GOS substrate (e.g., 25-30° C.). Hence, although in-situ bow may still occur to some extent in the presence of the back-side stress-tuning material, the bow is reduced to below a threshold level. In exemplary embodiments, the stress-tuning material is a permanent architectural feature retained all the way through IC packaging, chip-level integration, and/or board-level integration.

FIG. 1 is a flow diagram illustrating back-side processing of GOS substrates and integrating devices made on such substrates, in accordance with embodiments. Method 101 begins at operation 105 where a silicon substrate 205 is received, as further illustrated by FIG. 2. In some embodiments, silicon substrate 205 is monocrystalline having a predetermined crystal orientation. Crystallographic orientation of a substantially monocrystalline silicon substrate 205 may be any of (100), (111), or (110). Other crystallographic orientations are also possible. In one exemplary silicon substrate embodiment, substrate 205 is (100) silicon. For a (100) silicon substrate, the front side surface may advantageously miscut, or offcut, for example 2-10° toward [110], to facilitate nucleation of III-N material layers. In some exemplary embodiments, substrate diameter D is at least 300 mm and $T_1$ is approximately 775 µm. In advantageous embodiments, substrate diameter D is 450 mm and $T_1$ is at least 900 µm.

At operation 110, stress-tuning material 240 is deposited on a back-side of silicon substrate 205. In some embodiments represented by FIG. 1, stress-tuning material 240 is blanket-deposited over the entire substrate diameter D. During deposition operation 110, silicon substrate front-side 207 may be protected with any known sacrificial hardmask material (not depicted) when a single-sided deposition process is employed at operation 110. Alternatively, stress-tuning material 240 may be deposited on both silicon substrate back-side 206 and front-side 207, and subsequently stripped off front-side 207. Stress-tuning material 240 may be deposited by epitaxy, atomic layer deposition (ALD), chemical vapor deposition (CVD), or physical vapor deposition (PVD), for example.

Film thickness and/or film composition and/or intrinsic film stress of stress-tuning material 240 may be targeted based on the level of in-situ bow associated with the subsequent epitaxial growth operation 115. In exemplary embodiments represented by FIG. 2, III-N material layers 225 are epitaxially grown at operation 115 with a high temperature epitaxial process exceeding 900° C. (e.g., 1000° C.). Knowledge of the threshold level of in-situ bow silicon substrate 205 can sustain without experiencing hot plastic deformation may be utilized to vary properties of stress-tuning material 240 so as to at least avoid reaching the critical stress level.

III-N material layers 225 may include any of AlN, GaN, AlGaN, InAlGaN, and the like. In some embodiments, III-N material layers 225 include at least one GaN device layer 220. In exemplary embodiments, at least GaN layer 220 has monocrystalline microstructure. Crystal quality of GaN layer 220 may vary dramatically as a function of the material composition and techniques employed to form GaN layer 220. For example, GaN layer 220 may have a dislocation density as high as $10^8$-$10^{11}$/cm$^2$. In some embodiments, the c-axis of III-N material layers 225 is ideally aligned approximately normal to the front-side surface of silicon substrate 205. Practically however, the c-axis may be slightly tilted, for example a few degrees less than normal, for example as a result of imperfect epitaxial growth on an offcut or off-axis substrate, etc. In some embodiments, the {000-1} plane is more proximate silicon substrate 205. Such embodiments may be referred to as Ga polarity (+c) because the three bonds of Ga (or other group III element) point towards a substrate (not illustrated). For alternate embodiments where the three bonds of Ga (or other group III element) point in the opposite direction, GaN layer 220 would be referred to as N polarity (−c).

III-N material layers 225 may vary in thickness, but in exemplary embodiments have a total thickness of at least 1 µm, advantageously at least 3 µm, and may be 5 µm, or more. GaN device layer 220 likewise may vary in thickness, but in exemplary embodiments has a thickness of at least 1 µm, advantageously 1-3 µm, and may be 4 µm, or more. GaN films of such thicknesses grown at high temperatures may be stressed in the many hundreds of MPa. In some embodiments, GaN device layer 220 is disposed directly on an AlN nucleation layer 215, which is disposed on silicon substrate 205. In the embodiment illustrated in FIG. 2 however, GaN device layer 220 is disposed on an AlGaN transition layer 215. AlGaN transition layer 215 may comprise one or more material layers where the group III sub-lattice ranges for example from 80-90% Al in a portion of transition layer 215 proximate to AlN layer 210, down to 10-20% in a portion of transition layer 215 proximate GaN layer 220. GaN device layer 220 may include a GaN channel material, and one or more polarization layers (e.g., AlN, and/or AlInN, and/or AlGaN, and/or InGaN) to create a two dimensional electron gas (2DEG) within the channel material. Other exemplary device layer materials include one or more tunneling layer materials, quantum well structure materials (e.g., InGaN), and the like.

Figure 2:
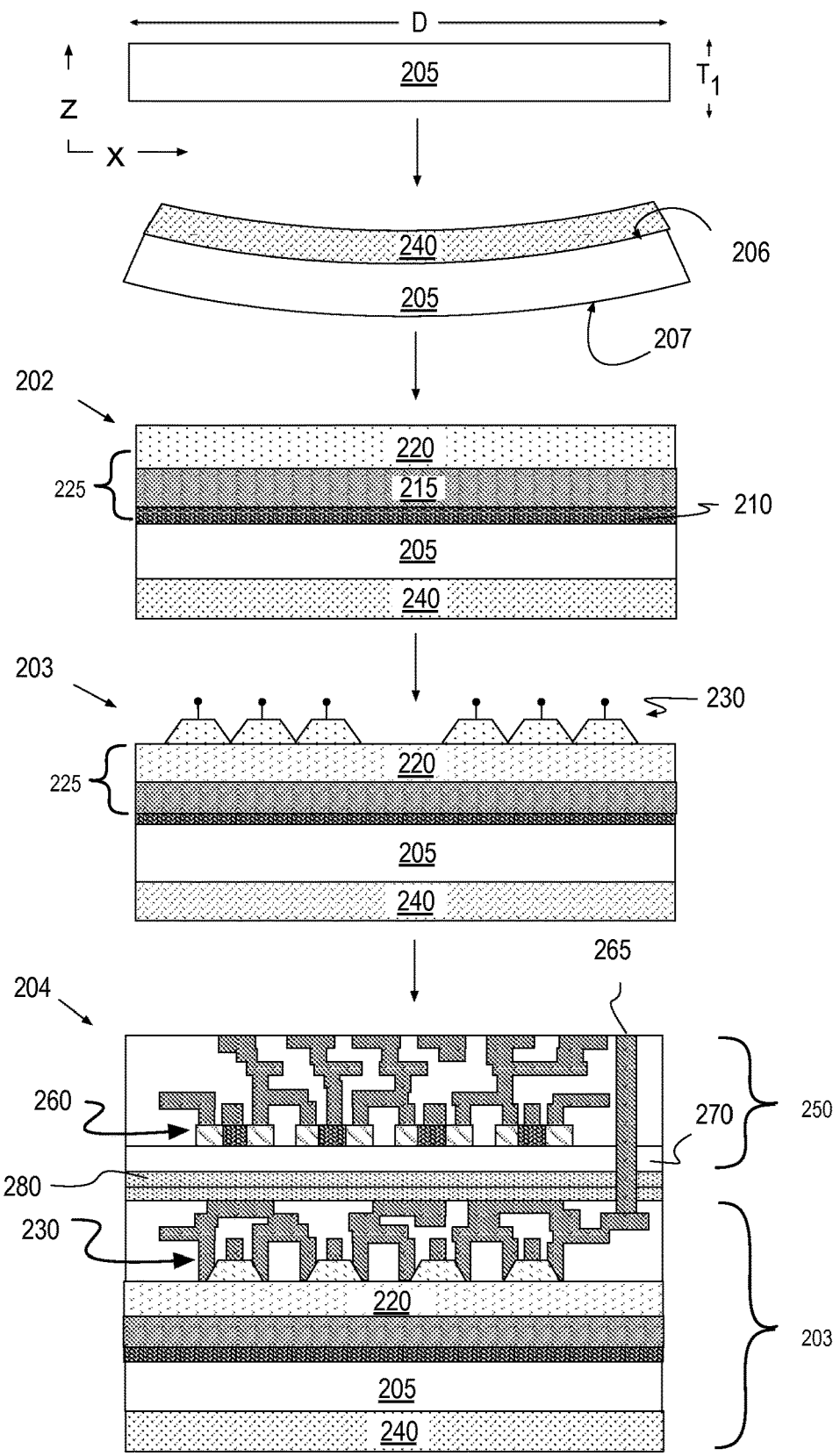
FIG. 2 illustrates cross-sectional views of GOS substrates including a back-side stress-tuning material, in accordance with some embodiments.

For embodiments represented by FIG. 2, AlGaN transition layer 215 may be employed in conjunction with stress-tuning material 240 to tune wafer flatness. Depending on Al content, lattice mismatch stress between AlGaN transition layer 215, AlN nucleation layer 210, and GaN device layer 220 may supplement stress induced by stress-tuning material 240 to arrive at a flat GOS substrate condition after III-N material layers 225 are grown and the GOS substrate cooled to ambient room temperature.

To counter stress in III-N material layers 225, stress-tuning material 240 may be under compressive or tensile stress at room temperature (25-30° C.). Levels of stress in stress-tuning material 240 may be engineered based, at least in part, on the linear thermal coefficient of expansion of the material relative to that of silicon substrate 205 and III-N material layers 225 so as to best limit strain in silicon substrate 205 during and after III-N epitaxial growth. III-N epitaxial materials 225 are typically under compressive stress at elevated growth temperatures, becoming tensile upon cooling. In-situ bow may then be positive during growth with the bow becoming negative upon cooling to ambient room temperature. A stress-tuning material 240 under compressive stress at III-N epitaxial growth temperatures may therefor reduce positive in-situ bow preventing curvature from exceeding a threshold associated with plastic deformation of substrate 105, thereby improving post-epitaxy flatness. A stress-tuning material 240 under tensile stress at ambient room temperature may reduce negative in-situ bow, again improving post-epitaxy flatness.

In exemplary embodiments represented by FIG. 1, stress-tuning material 240 is under tensile stress at room temperature. Tensile stress in stress-tuning material 240 may, but need not, induce significant bow in silicon substrate 205. Any bow induced by stress-tuning material 240 is to remain below the threshold bow silicon substrate 205 can sustain at the deposition temperature employed at stress-tuning operation 110 without undergoing permanent warpage. In some embodiments, stress-tuning material 240 is deposited at a relatively low deposition temperature, for example no more than 800° C., and advantageously no more than 450° C. At low temperatures, substrate 205 will not undergo plastic deformation as a result of stress induced by stress-tuning material 240. Stress-tuning material 240 may also be deposited at high deposition temperatures, for example with an epitaxial process exceeding 950° C. In such embodiments however, total stress in stress-tuning material 240 may be limited to a lower threshold so as to avoid plastically deforming substrate 205 at stress-tuning operation 110.

In exemplary embodiments, stress-tuning material 240 has a positive linear thermal coefficient of expansion that is at least 4 ppm/° C. and advantageously between 4.5 ppm/° C. and 6 ppm/° C. III-N material layers 225 also have positive thermal coefficients of expansion within this range, so a sufficient thickness stress-tuning material 240 may then nearly balance front-side and back-side film stress over processing temperature cycles. In exemplary embodiments where epitaxial processes employed to form III-N material layers 225 are single-sided and include one or more high-temperature process of 900-1100° C., stress-tuning material 240 has a composition distinct from III-N material layers 225. Stress-tuning material 240 may however advantageously include a III-N material layer as the thermal coefficient of expansion may then be well-matched to III-N material layers 225. In some such embodiments, stress-tuning material 240 comprises AlN under tensile stress at ambient room temperature. A crystalline AlN stress-tuning material 240 may be epitaxially grown, or a polycrystalline AlN stress-tuning material 240 may be formed by ALD or sputtered deposited. A crystalline AlN stress-tuning material 240 may be grown at a low-temperature (LT) and have a high defect density. In exemplary embodiments, the thickness of the AlN exceeds the thickness of AlN nucleation layer 210. Stress-tuning layers 240 may also include a high-temperature (HT) III-N material layer, such as but not limited to HT-AlGaN and/or GaN.

In alternative embodiments, stress-tuning material 240 is silicon nitride ($Si_xN_y$), which may be advantageously sputter deposited with conditions that are tunable to place stress-tuning material 240 under tensile or compressive stress. In still other embodiments, stress-tuning material 240 may be any of thermal oxide ($SiO_2$), silicon oxynitride ($SiO_xN_y$), carbon-doped oxide ($SiO_xC$), titanium, tungsten, titanium-tungsten alloys (TiW), chromium (Cr), and nickel-vanadium (NiV), any of which may also be sputter deposited, for example. These materials are compatible with high temperature III-N epitaxy processes. These materials have a suitable thermal coefficient of expansion, adhere well to silicon substrate surfaces, and can be deposited at various pressures and magnetron powers to achieve a predetermined film stress suitable for counterbalancing stress in the III-N materials 225. These materials are also advantageously compatible with back-side processing employed in many advanced packaging processes (e.g., under-bump metallization and redistribution layers). For embodiments where substrate 205 is to remain full-thickness, stress-tuning material 140 applied prior to III-N epitaxy may be further utilized downstream for GaN-device interconnection/packaging purposes, as described further below.

Film thickness of stress-tuning material 240 depends, at least in part, on characteristics of the III-N epitaxial layers. For example, stress-tuning material may be thinner for a GOS substrate that includes an AlGaN transition layer than for one that does not. In some exemplary embodiments, stress-tuning material 240 has a thickness of at least 0.1 µm, and may be 1 µm, or more. In embodiments where a highly stressed silicon oxynitride for example, a thickness of ~100 nm may be sufficient.

In some embodiments, after forming engineered GOS substrate 202, method 101 continues at operation 120 where GaN devices 230 are fabricated on GaN device layer 220. Any known techniques may be utilized to fabricate any known GaN-based device, such as, but not limited to, GaN channeled HEMT, GaN channeled MOS-HEMT, and GaN-based LED. Throughout GaN device fabrication, and any conventional back end of line interconnect fabrication, stress-tuning material 240 may remain on the back-side of silicon substrate 205 to maintain GOS substrate flatness.

In further embodiments, a GaN device substrate formed at operation 120 may be further integrated with a CMOS device substrate, which may be transferred onto the GaN device substrate as further described elsewhere herein. Stress-tuning material may again remain on the back-side of the silicon substrate to maintain GOS substrate flatness throughout the substrate transfer process. FIG. 2 illustrates an exemplary a GaN device substrate 203 vertically integrated with a CMOS device substrate 250 to form a 3D IC 204. GaN device substrate 203 may be stacked with one or more CMOS device substrate 250, either at wafer-level (e.g. 3DWLP) or die-level (e.g., 3D-SIC) using any known 3D IC technology suitable for the application. In some embodiments, a die bonding or wafer bonding process is employed to physically adhere bonding layers 280. Any known bonding process may be employed as embodiments herein are not limited in this respect. Vertical interconnect 265 represents an exemplary "via last" TSV architecture that may provide power to GaN devices 230 and/or interconnect GaN devices 230 to CMOS controller circuitry implemented by silicon MOS transistors 260.

In embodiments represented by FIG. 2, silicon MOS transistors 260 are disposed on a thin silicon substrate 270 having a thickness less than 100 µm. Silicon substrate 205 associated with GaN device substrate 203 has a greater thickness, for example remaining at full thickness $T_1$, which may be approximately 775 µm for a 300 mm embodiment. Stress-tuning material 240 is also retained in 3D IC 204. Retention of the full GOS substrate 203 has the advantage of maintaining flatness through any wafer-level 3D IC processing operations. Because of the greater thickness of silicon substrate 205, bonding layers 280 are disposed between a back-side of thinned silicon substrate 270 and a top side of GaN device substrate 203. 3D IC 204 is therefore a "CMOS top-GaN bottom" integration scheme. In some embodiments, GaN devices 230 are high voltage transistors (e.g., GaN-channeled FETs) while silicon MOSFETs 260 implement a controller circuit in CMOS. For some specific embodiments, 3D IC 404 is a high-voltage RF power amplifier 3D SoC.

Figure 3:
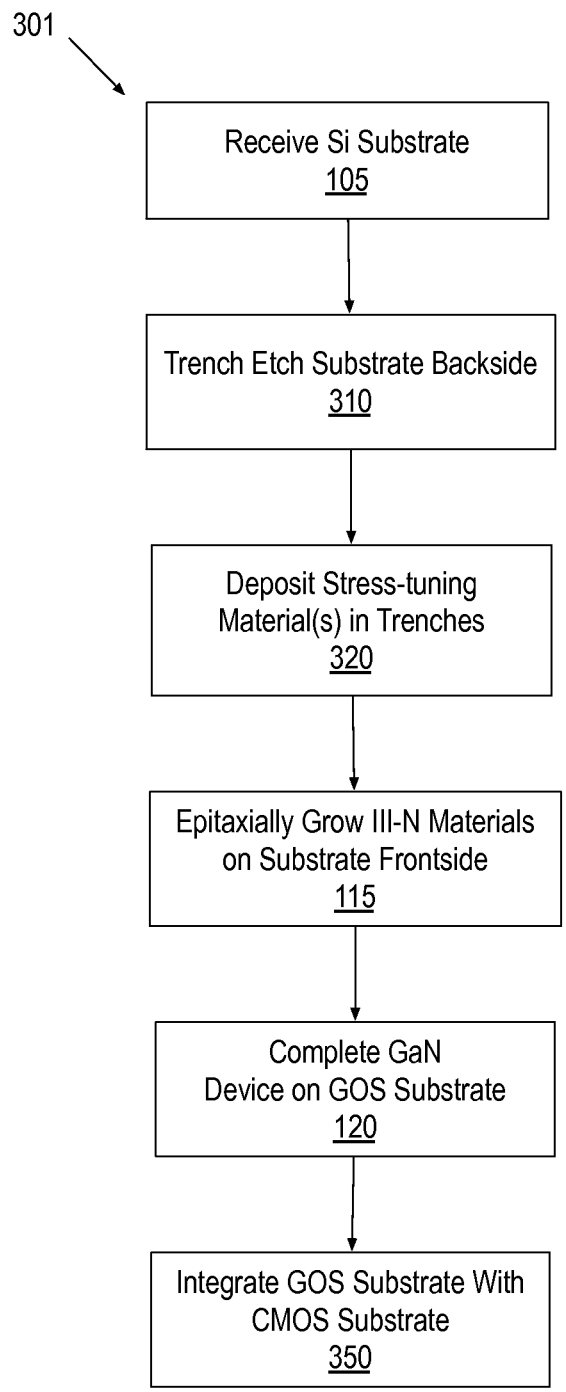
FIG. 3 is a flow diagram illustrating back-side processing of GOS substrates and integrating devices made on such substrates, in accordance with embodiments.
Figure 4:
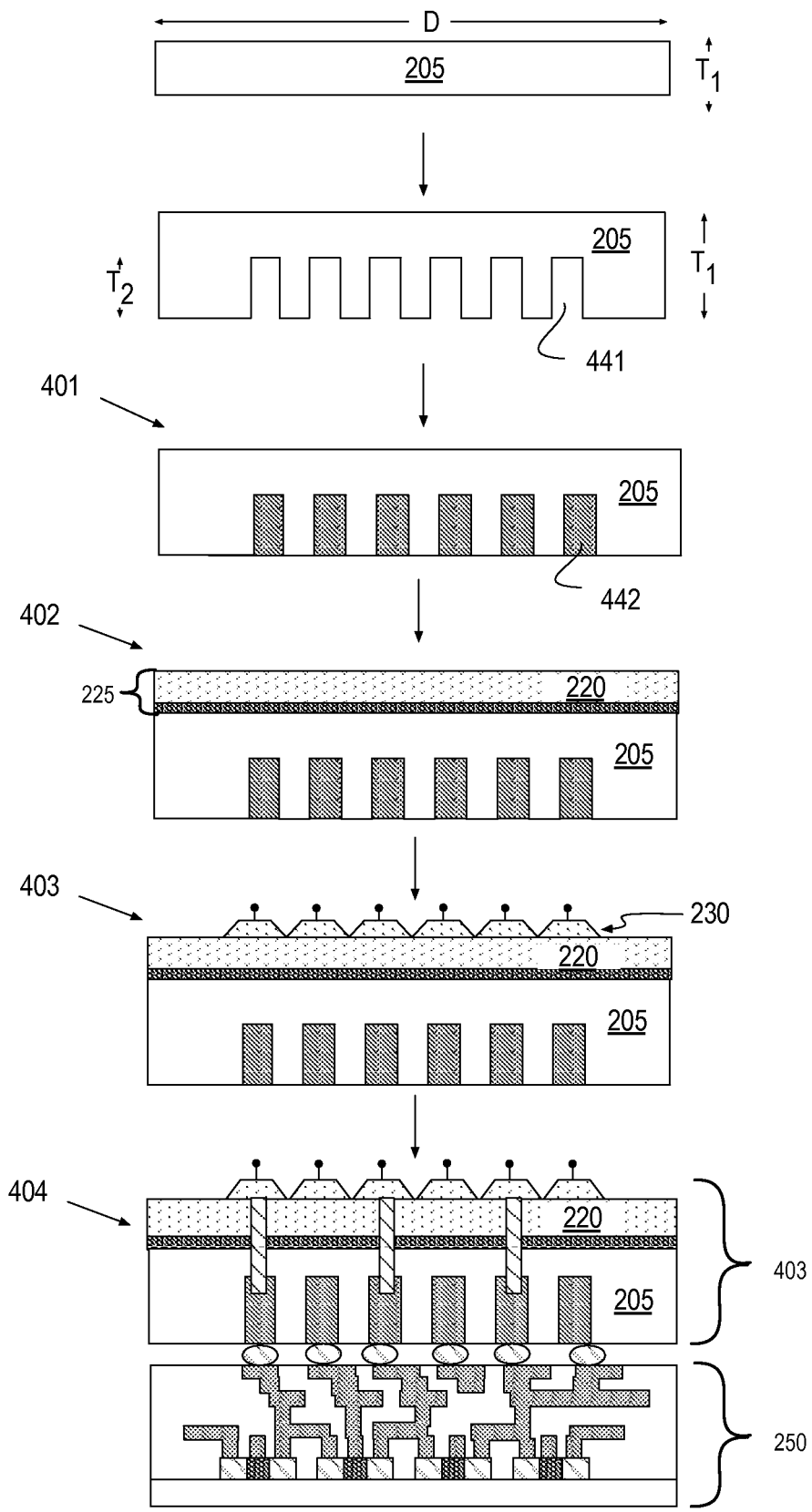
FIG. 4 illustrates cross-sectional views of GOS substrates including back-side stress-tuning structures, in accordance with some embodiments.

In some embodiments, a GOS substrate includes a silicon substrate with back-side stress-tuning structures. Back-side stress-tuning structures may be formed prior to III-N epitaxial growth to enhance the application of stress-tuning material described above, or to improve the silicon substrate's ability to absorb stresses experienced during the epitaxial growth without plastically deforming. FIG. 3 is a flow diagram illustrating back-side processing of GOS substrates and integrating devices made on such substrates, in accordance with some embodiments. FIG. 4 illustrates cross-sectional views of GOS substrates including back-side stress-tuning structures, in accordance with some embodiments.

Referring first to FIG. 3, method 301 begins with receiving silicon substrate 205 at operation 105, as described above in the context of method 101 (FIG. 1). At operation 310, a back-side of silicon substrate 205 is trench etched, for example using any known deep silicon etch (e.g., a through-silicon via etch process), to form a non-planar back-side surface with a plurality of back-side trenches or recesses 441 (FIG. 4). One or more stress-tuning materials, or stress-absorbing materials, 442 are deposited in the trenches at operation 320 to form a stress engineered silicon substrate 401. At operation 115, III-N materials are epitaxially grown on the stress engineered silicon substrate substantially as described above in the context of method 101 to form a large diameter GOS substrate 402 having the desired flatness. At operation 120, any GaN-based device 230 is fabricated in GOS substrate 402 with any known technique to form a GOS device substrate 403. In some further embodiments described below, method 301 includes operation 350 where any known assembly technique is employed to form a 3D IC 404 including both GOS device substrate 403 and a CMOS device substrate 250.

Back-side trenches may be uniformly distributed over the substrate area, or localized to specific regions. In further reference to FIG. 4, back-side trenches 441 may have a wide range of dimensions. In exemplary embodiments, back-side trenches 441 have critical lateral dimensions in the 5-100 μm range with depths of 10-300 μm. In the illustrated embodiment, back-side trenches 441 do not extend through the entire silicon substrate thickness. However, in some embodiments, back-side trenches 441 may have sufficiently large lateral dimension to extend completely through the thickness of substrate 205.

Figure 5A:
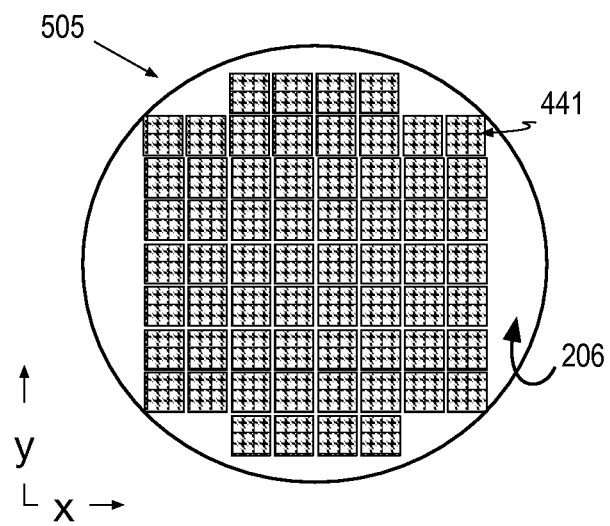
FIGS. 5A and 5B are plan views of back-side stress-tuning structures on GOS substrates, in accordance with some embodiments.
Figure 5B:
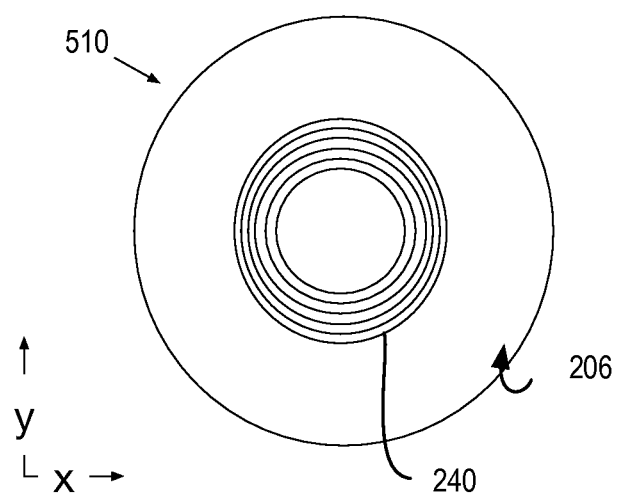

FIGS. 5A and 5B are plan views of back-side stress-tuning structures on GOS substrates, in accordance with some embodiments. In the example of FIG. 5B, GOS substrate 505 has a back-side 206 comprising a grid of back-side trenches 441 extending over a majority of the substrate area. The grid pattern may advantageously manage substrate stress in two dimensions uniformly over the substrate area. In the example of FIG. 5B, GOS substrate 510 has a non-planar back-side 206 comprising annular back-side trenches 441. Annular back-side trenches may extend over the entire back-side surface of substrate 510, or be limited between inner and outer substrate radii. Annular back-side trenches may advantageously manage substrate stress having radial symmetry.

In some embodiments, back-side stress-tuning structures formed in a silicon substrate are backfilled with one or more stress-tuning material. The backfilling process may proceed by any known damascene technique (e.g., overfill and polish). Using such a technique, any of the stress-tuning materials described above for blanket film embodiments may be utilized to backfill one or more back-side trench. Trench patterning and backfilling may be utilized to limit application of a stress-tuning material to specific regions of a substrate back-side. Complex stress fields may be induced in this manner, either to accommodate complex stress fields induced during the subsequent III-N material epitaxy, or to engineer strain on different device regions of the GOS substrate. In some embodiments, stress-tuning material is disposed in trenches located within substrate regions where III-N material is epitaxially formed on the front-side of the substrate. Hence, stress-tuning material may be localized for embodiments where III-N material is also localized (i.e., where III-N material is not a blanket film covering the entire silicon substrate diameter).

Figure 5C:
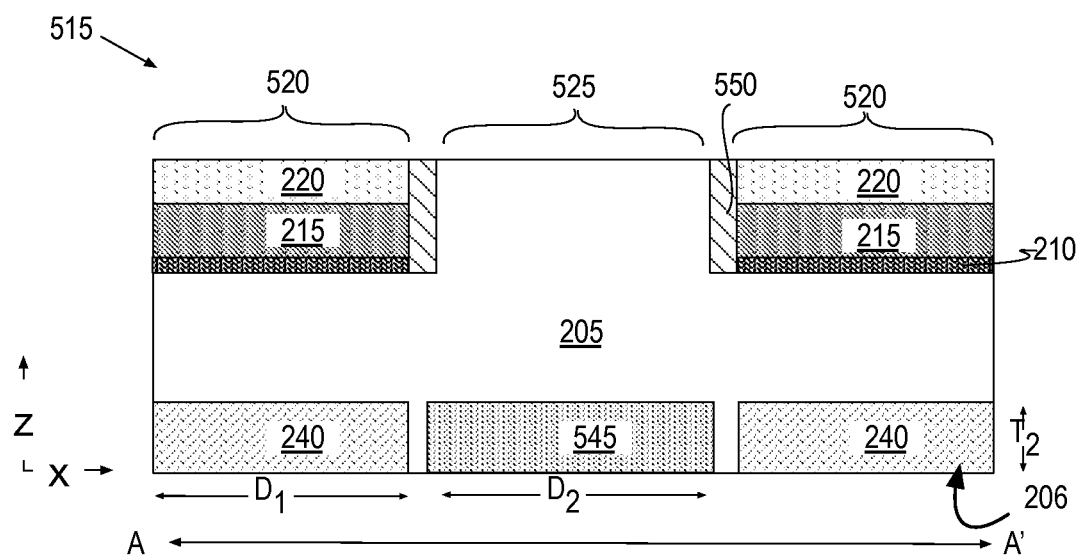
FIG. 5C is a cross-sectional view of a GOS substrate including back-side stress-tuning structures, in accordance with some embodiments.
Figure 5D:
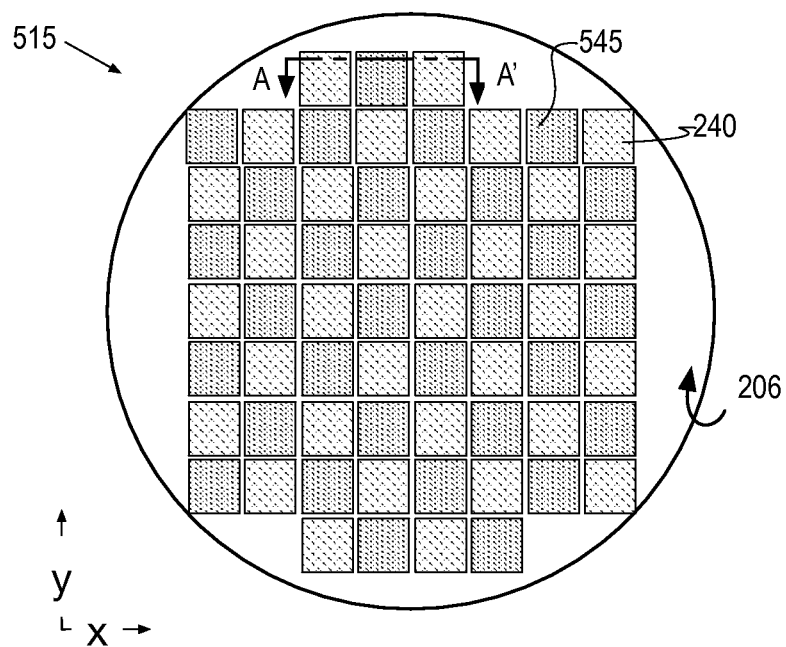
FIG. 5D is a plan view of back-side stress-tuning structures on GOS substrates, in accordance with some embodiments.

FIG. 5C is a cross-sectional view of a GOS substrate 515 including selectively backfilled back-side stress-tuning structures, in accordance with some embodiments. FIG. 5D is a plan view of selectively backfilled back-side stress-tuning structures on GOS substrate 515, in accordance with some embodiments. GOS substrate 515 includes GaN device regions 520 and silicon device regions 525 separated by trench isolation dielectric 550. In the illustrative embodiment, a first back-side trench is backfilled with stress-tuning material 240 while a second back-side trench is backfilled with a different stress-tuning material 545. The back-side trench layout forms a pattern (e.g., checkerboard) of alternating stress-tuning materials 240 and 545 having lateral critical dimensions $D_1$, and $D_2$ corresponding to GaN device and silicon device regions 520, 525, respectively. Stress-tuning material 545 may be any of the materials described above for stress-tuning material 240, for example. In the illustrative embodiment, stress induced by III-N materials (e.g., GaN device layer 220, AlGaN transition layer 215, and AlN nucleation layer 210) originates within GaN device regions 520. In the absence of overlying III-V material, stress-tuning material 545 might then induce less pre-stress than does stress-tuning film 240. In other embodiments, silicon device regions 525 may be independently strain-engineered with stress-tuning material 545 introducing stress into the localized silicon device region 525 as a function of the back-side trench geometry. A stress-tuning material 545 may then be selected to be compressive or tensile so as to induce carrier mobility enhancements in the silicon devices (e.g., compressive for a pMOS device region and tensile for an nMOS region).

In some embodiments, back-side stress-tuning features formed in a silicon substrate are backfilled with one or more stress absorbing material to enhance the stress absorption capabilities of the silicon substrate. Elastic deformation may preferentially occur within the stress absorbing material during a subsequent III-N epitaxial process, thereby avoiding plastic deformation of the silicon substrate. Exemplary stress-absorbing materials include metals, and flowable and/or porous dielectric materials, such as any of those employed as inter-layer dielectrics (ILD). In some embodiments, back-side trenches are backfilled with a low-k dielectric material having a relative dielectric constant less than 2.0, such as porous silsesquioxane, or the like.

For some embodiments in which the stress absorbing or stress-tuning material is a metal backfilled in a back-side trench, the backfilled trench may manage stress/strain within the GOS substrate and improve heat dissipation and/or provide interconnection to GaN-based devices formed in the GOS substrate. Many applications may employ GaN-based devices in high voltage/high power circuits or RF power amplifiers, which generate considerable heat. Heat dissipation is particularly difficult for GaN devices disposed on thick GOS substrates. Backfilling back-side trenches with metals having greater thermal conductivity than silicon will improve dissipation through the thick silicon substrate. In further embodiments, the backfilled trenches are subsequently bonded to a heat sink (not depicted).

Figure 6A:
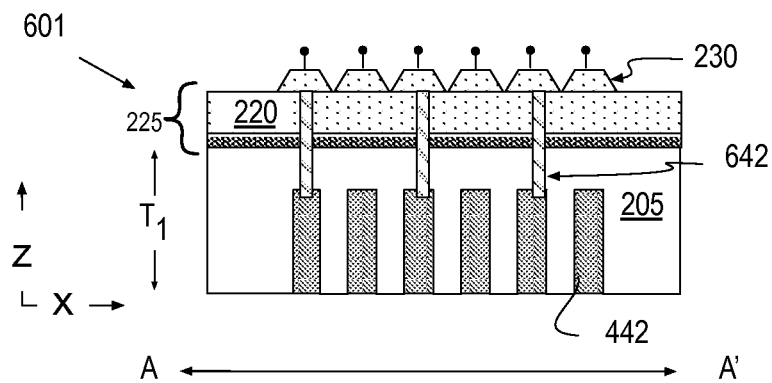
FIG. 6A is a cross-sectional view of a GOS substrate including back-side stress-tuning structures, in accordance with some embodiments.

In some embodiments, the stress absorbing or stress-tuning material is a metal and further provides vertical electrical interconnection through the GOS substrate. Engineering of the GOS substrate back-side to accommodate stress associated with epitaxy of III-N materials may be therefore further leveraged as a means of electrical interconnection in a final GOS device die or chip. FIG. 6A is a cross-sectional view of a GOS device substrate 601 including non-planar back-side stress-tuning structures backfilled with metal stress-tuning material 442, in accordance with some embodiments. In the illustrated embodiment, metal stress-tuning material 442 extends from a back-side surface of silicon substrate 205 through less than the entire silicon substrate thickness $T_1$ (e.g., <775 μm). For example, III-N materials 225 may be epitaxially grown on a top crystalline surface of substrate 205 that is separated from metal stress-tuning material 442 by 30-75 μm of silicon substrate thickness. Through-silicon-via (TSV) 642 extends through this substrate thickness between GaN-based devices 230 and metal stress-tuning material 442. TSV 642 lands or intersects metal stress-tuning material 442 embedded into the substrate back-side prior III-N epitaxial growth (as opposed to being an unlanded via that is eventually exposed with substrate thinning). The combined vertical runs of TSV 642 and metal stress-tuning material 442 embedded in the substrate back-side provide interconnection through the thick silicon of the GOS structure. As illustrated in FIG. 6A, TSV 642 may have a smaller critical lateral dimension than that of back-side stress-tuning features. For example, TSV 642 may have a diameter of 3-10 μm and an aspect ratio of 10 or more, to extend through 50 μm, or more, of substrate 205. Any known TSV process may be integrated with the back-side stress-tuning structures described herein. For example TSV 642 may be fabricated with a "via-first" or "via-middle" process integrated with fabrication of GaN-based devices 230.

Figure 6B:
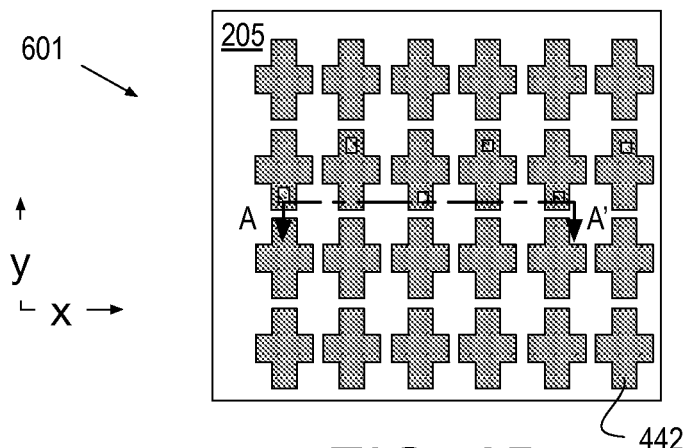
FIG. 6B is a plan view of back-side stress-tuning structures on GOS substrates, in accordance with some embodiments.
Figure 6C:
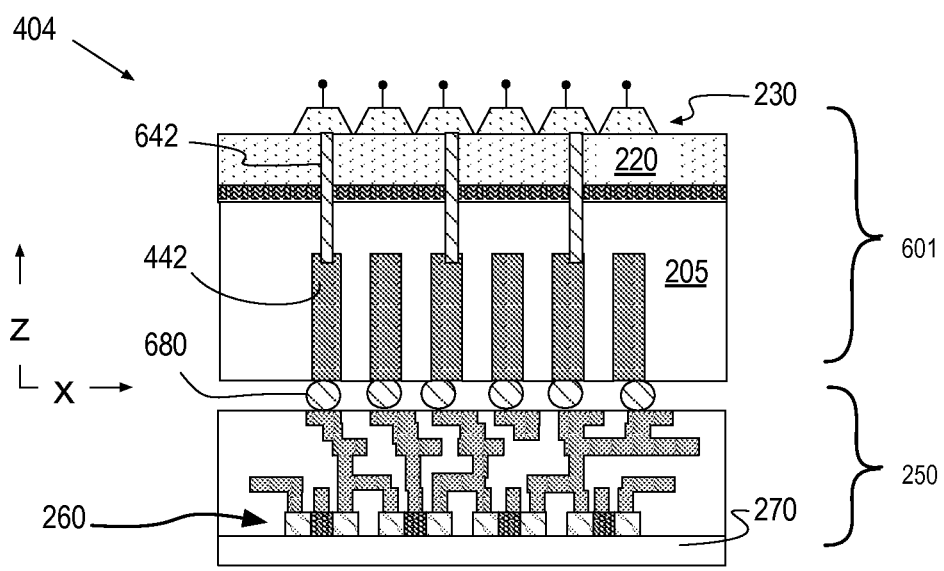
FIG. 6C is a cross-sectional view of a 3D IC structure including silicon-based CMOS devices disposed on a thin silicon substrate and III-N-based devices disposed on a stress-engineered silicon substrate, in accordance with some embodiments.

FIG. 6B is a plan view of non-planar back-side stress-tuning structures of GOS device substrate 601, in accordance with some embodiments. The A-A' line of the cross-sectional view in FIG. 6A is also denoted in FIG. 6B. As further shown in FIG. 6B, the back-side stress-tuning structures filled with metal stress-tuning material 442 approximate a grid in the x-y dimensions for the sake of stress-control over the substrate area. Each individual back-side stress-tuning structures is electrically isolated from its neighbors for the sake of independent electrical interconnection. FIG. 6C is a cross-sectional view of a 3D IC 404 including silicon-based CMOS devices 260 disposed on thinned silicon substrate 270, and III-N-based devices 230 disposed on a stress-engineered thick silicon substrate 205, in accordance with some embodiments. In contrast to 3D IC 204 described elsewhere herein, 3D IC 404 exemplifies "GaN top-CMOS bottom" integration scheme. Bumps 680 electrically couple CMOS device substrate 250 with GaN device substrate 601. A bump 680 make contacts with one metal stress-tuning material 442, which further interconnects to TSV 642 that conveys power and/or signal between GaN devices 230 and silicon MOSFETs 260. In some embodiments, GaN devices 230 are high voltage transistors (e.g., GaN-channeled FETs) while silicon MOSFETs 260 implement a controller circuit in CMOS. For some such embodiments, 3D IC 404 is a high voltage and/or RF power amplified 3D SoC.

Figure 7:
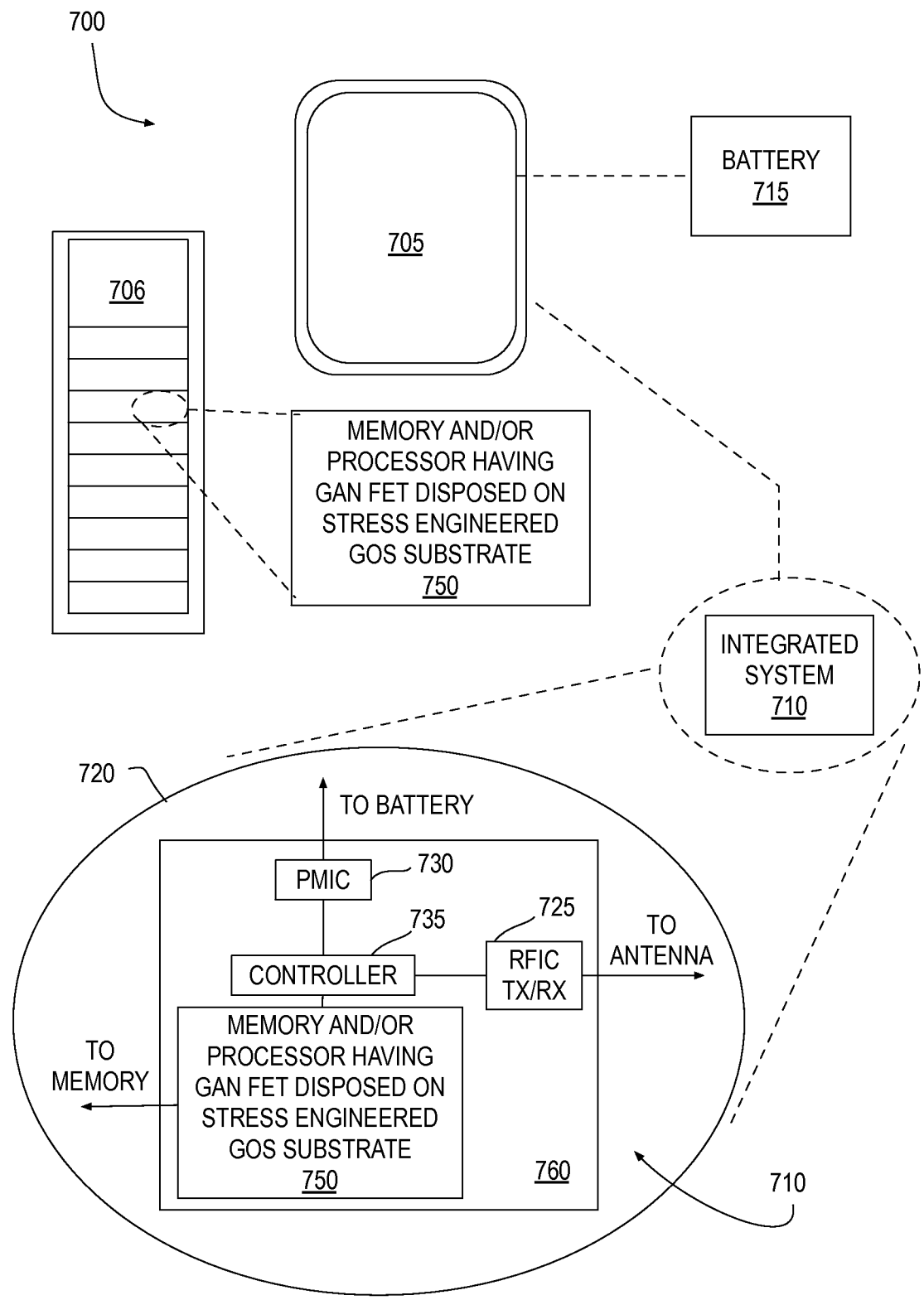
FIG. 7 illustrates a mobile computing platform and a data server machine employing a 3D IC including silicon FETs on a thin silicon substrate and GaN HFETs on a stress-engineered silicon substrate, in accordance with embodiments of the present invention.

FIG. 7 illustrates a system 700 in which a mobile computing platform 705 and/or a data server machine 706 employs an IC including at least one GaN HFET disposed on a stress-engineered GOS substrate, for example in accordance with embodiments of the present invention. The server machine 706 may be any commercial server, for example including any number of high-performance computing platforms disposed within a rack and networked together for electronic data processing, which in the exemplary embodiment includes a packaged monolithic IC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Disposed within the integrated system 710 illustrated in the expanded view 720, or as a stand-alone packaged chip within the server machine 706, packaged monolithic IC 750 includes a memory chip (e.g., RAM), or a processor chip (e.g., a microprocessor, a multi-core microprocessor, graphics processor, or the like) with at least one GaN HFET disposed on a stress-engineered GOS substrate, for example in accordance with embodiments of the present invention. The monolithic IC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprising a power amplifier on a transmit path and a low noise amplifier on a receive path), and a controller thereof 735. In some embodiments, controller 735 is implemented in silicon CMOS die stacked upon RFIC 725 implemented with GaN HFETs disposed on a stress-engineered GOS substrate.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 750 or within a single IC coupled to the package substrate of the monolithic IC 750.

Figure 8:
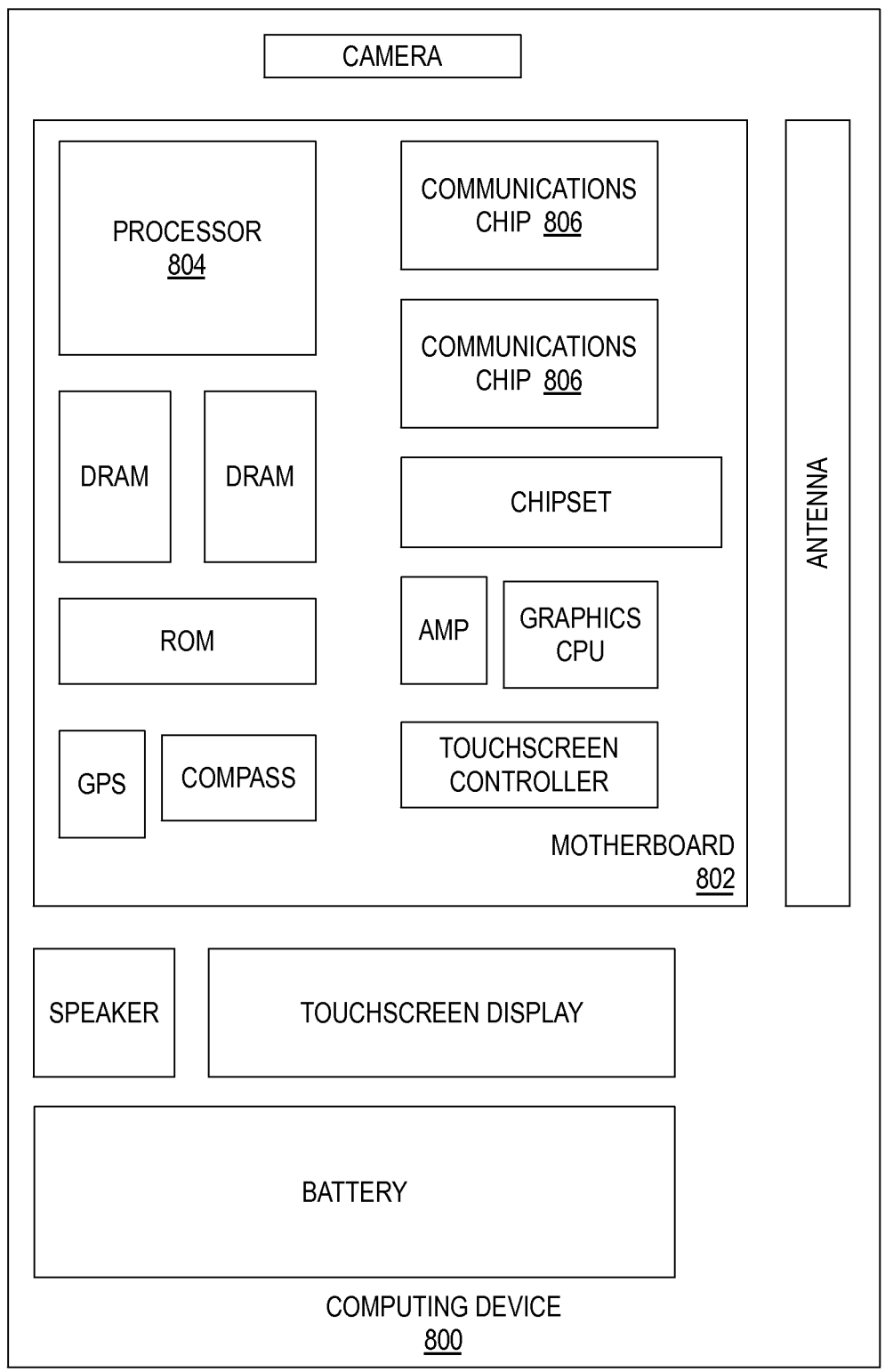
FIG. 8 is a functional block diagram of an electronic computing device, in accordance with an embodiment of the present invention.

FIG. 8 is a functional block diagram of a computing device 800, arranged in accordance with at least some implementations of the present disclosure. Computing device 800 may be found inside platform 705 or server machine 706, for example. Device 800 further includes a motherboard 802 hosting a number of components, such as, but not limited to, a processor 804 (e.g., an applications processor), which may further incorporate at least one GaN HFET disposed on a stress-engineered GOS substrate, for example in accordance with embodiments of the present invention. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a III-N semiconductor device structure comprises one or more single-crystalline III-N semiconductor material layers disposed on a front-side of a silicon substrate, a microelectronic device disposed over the substrate front-side and employing at least one of the III-N semiconductor material layers, and a stress-tuning material disposed on a back-side of the silicon substrate that reduces bow in the silicon substrate induced by the one or more single-crystalline III-N semiconductor material layers.

In at least one of the first embodiments, the stress-tuning material has a linear coefficient of thermal expansion between 4 and 6 ppm/° C.

In at least one of the first embodiments, the stress-tuning material comprises at least one of aluminum nitride, silicon nitride, titanium, tungsten, TiW, chromium, or nickel-vanadium.

In at least one of the first embodiments, the silicon substrate has a thickness of at least 775 µm, the III-N semiconductor material layers include a monocrystalline GaN layer having a thickness of at least 1 µm, and the stress-tuning material has a thickness of at least 0.25 µm.

In at least one of the first embodiments, the stress-tuning material is disposed within a trench in the substrate back-side.

In the first embodiment immediately above, the stress-tuning material further comprises a first stress-tuning material disposed within a first trench in the substrate back-side, and a second stress-tuning material disposed within a second trench in the substrate back-side.

In the first embodiment immediately above, the III-N semiconductor material layers are disposed over a first region of the substrate front-side and silicon-channeled MOSFETs are disposed over a second region of the substrate front-side, the first trench is disposed opposite the first region of the substrate, and the second trench is disposed opposite the second region of the substrate.

In at least one of the first embodiments, the stress-tuning material is a metal, the trench extends into the substrate from the substrate back-side a depth of at least 50 µm, a metal-filled via extends through the substrate from the substrate front-side and intersects the metal stress-tuning material.

In one or more second embodiments, a three-dimension integrated circuit (3D IC) comprises a silicon CMOS die comprising plurality of silicon MOSFETs disposed on a thin silicon substrate, a high voltage die stacked with the silicon CMOS die, the high voltage die comprising a plurality of GaN-channeled high electron mobility transistors (HEMTs) disposed on a GaN-On-Silicon (GOS) substrate having one or more single-crystalline III-N semiconductor material layers, wherein the GOS substrate includes a thick silicon substrate of greater thickness than the thin silicon substrate, and a stress-tuning material is disposed on a back-side of the GOS substrate, opposite the HEMTs, that reduces bow in the GOS substrate induced by the one or more single-crystalline III-N semiconductor material layers.

In at least one of the second embodiments, the stress-tuning material is a metal disposed in a trench embedded in the back-side of the GOS substrate, and a bump metal joins the stress-tuning material to the silicon CMOS die or a heat sink.

In the second embodiment immediately above, the high voltage die further comprises a through via landed on the stress-tuning material.

In the second embodiment immediately above, the thin silicon substrate is bonded to the high voltage die on a side opposite the stress-tuning layer, and a through via extends through the thin substrate and couples with the high voltage die.

In at least one of the second embodiments, the stress-tuning material has a linear coefficient of thermal expansion between 4 and 6 ppm/° C., the thick silicon substrate has a thickness of at least 775 µm, and the thin silicon substrate has a thickness less than 100 µm.

In one or more third embodiments, a GaN-On-Silicon (GOS) substrate comprises one or more single-crystalline III-N semiconductor material layers including a GaN layer having a thickness of at least 1 µm disposed on a silicon substrate having a diameter of at least 300 mm, and a stress-tuning material disposed on a back-side of the GOS substrate opposite the GaN layer to reduce bow in the GOS substrate induced by the one or more single-crystalline III-N semiconductor material layers.

In at least one of the third embodiments, the silicon substrate has a thickness of at least 775 µm, and the stress-tuning material has a linear coefficient of thermal expansion between 4 and 6 ppm/° C.

In one or more fourth embodiments, a method of forming a GaN-On-Silicon (GOS) substrate comprises receiving a silicon substrate having a diameter of at least 300 mm, depositing a stress-tuning material on a back-side of the silicon substrate, and epitaxially growing on a front-side of the silicon substrate one or more single-crystalline III-N semiconductor material layers including a GaN layer having a thickness of at least 1 µm.

In at least one of the fourth embodiments, the method further includes fetching a trench into the back-side of the silicon substrate, and depositing the stress-tuning material into the trench.

In at least one of the fourth embodiments, depositing the stress-tuning material further comprises depositing at least one of aluminum nitride, silicon nitride, titanium, tungsten, TiW, chromium, or nickel-vanadium by atomic layer deposition, or physical vapor deposition.

In one or more fifth embodiment, a method of forming a 3D IC comprises receiving a silicon CMOS die comprising plurality of silicon MOSFETs disposed on a thin silicon substrate. The method further comprises receiving a high voltage die comprising a plurality of GaN-channeled high electron mobility transistors (HEMTs) disposed on a GaN-On-Silicon (GOS) substrate having one or more single-crystalline III-N semiconductor material layers, wherein the GOS substrate includes a thick silicon substrate of greater thickness than the thin silicon substrate, and a stress-tuning metal is disposed on a back-side of the GOS substrate opposite the HEMTs. The method further comprises joining the silicon CMOS die to the high voltage die with a bump metal contacting the stress-tuning metal.

In at least one of the fifth embodiments, the thick silicon substrate has a thickness of at least 775 µm, and the thin silicon substrate has a thickness less than 100 µm.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A semiconductor device structure, comprising:
one or more single-crystalline III-N semiconductor material layers in a first region of over a front-side of a substrate comprising silicon;
one or more silicon-channeled MOSFETs in a second region over the front-side of the substrate;
a microelectronic device over the front-side of the substrate and incorporating at least one of the III-N semiconductor material layers; and
a first stress-tuning material within a first trench on a back-side of the substrate opposite the first region and a second stress-tuning material, different than the first stress-tuning material, within a second trench on a back-side of the substrate opposite the second region, at least the first stress-tuning material to counter stress in the substrate induced by the III-N semiconductor material layers.

2. The device structure of claim 1, wherein the first stress-tuning material has a linear coefficient of thermal expansion between 4 and 6 ppm/° C.

3. The device structure of claim 2, wherein the first stress-tuning material comprises at least one of III-N material, silicon nitride, silicon dioxide, silicon oxynitride, titanium, tungsten, TiW, chromium, or nickel-vanadium.

4. The device structure of claim 1, wherein:
the substrate has a thickness of at least 775 µtm;
the III-N semiconductor material layers include a layer comprising Ga and N that has a thickness of at least 1µm; and
the first stress-tuning material has a thickness of at least 0.25 µtm.

5. The semiconductor device structure of claim 1, wherein the first stress tuning material induces more stress within the first region than the second stress tuning material induces within the second region.

6. The semiconductor device structure of claim 1, wherein the second stress tuning material induces a stress within the second region.

7. A semiconductor device structure, comprising:
one or more single-crystalline III-N semiconductor material layers over a front-side of a substrate comprising silicon;
a microelectronic device over the front-side of the substrate and incorporating at least one of the III-N semiconductor material layers; and
a stress-tuning material located within a trench in a back-side of the substrate that counters stress in the substrate induced by the III-N semiconductor material layers, wherein:
the stress-tuning material is a metal;
the trench extends into the substrate from the back-side to a depth of at least 50 µtm; and
a metal-filled via extends through the substrate between the front-side and the backside, and the metal-filled via intersects the metal stress-tuning material.

8. A three-dimensional integrated circuit (3D IC), comprising:
a CMOS die comprising plurality of silicon MOSFETs disposed on a first substrate comprising silicon;
a high voltage die stacked with the CMOS die, the high voltage die comprising a plurality of III-N-channeled high electron mobility transistors (HEMTs) disposed on a GaN-On-Silicon (GOS) substrate having one or more single-crystalline III-N semiconductor material layers, wherein:
the GOS substrate includes a second substrate comprising silicon, the second substrate of greater thickness than the first substrate; and
a stress-tuning material is disposed on a back-side of the GOS substrate, opposite the HEMTs, that counters stress in the GOS substrate induced by the III-N semiconductor material layers.

9. The 3D IC of claim 8, wherein:
the stress-tuning material is a metal within a trench embedded in the back-side of the GOS substrate; and
a bump metal joins the stress-tuning material to the CMOS die or to a heat sink.

10. The 3D IC of claim 9, wherein the high voltage die further comprises a through via in contact with the stress-tuning material.

11. The 3D IC of claim 8, wherein:
the first substrate is bonded to the high voltage die on a side of the second substrate opposite the stress-tuning layer; and
a through via extends through the first substrate and couples with the high voltage die.

12. The 3D IC of claim 8, wherein:
the stress-tuning material has a linear coefficient of thermal expansion between 4 and 6 ppm/° C.;
the second substrate has a thickness of at least 775 µtm; and
the first substrate has a thickness less than 100 µtm.

13. A method of forming a GaN-On-Silicon (GOS) structure, the method comprising:
receiving a substrate having a diameter of at least 300 mm, wherein the substrate comprises monocrystalline silicon;
etching a trench on a back-side of the substrate;
depositing a stress-tuning material into the trench, the stress tuning material comprising a metal and inducing a first stress on the silicon substrate;
epitaxially growing on a front-side of the substrate one or more single-crystalline III-N material layers including a GaN layer having a thickness of at least 1µm, the III-N material layers inducing a second stress on the substrate, that is countered, at least in part, by the first stress;
forming a microelectronic device over the front-side of the substrate, the microelectronic device incorporating at least one of the III-N semiconductor material layers; and forming an electrical interconnect through the substrate to the microelectronic device, wherein the electrical interconnect comprises the stress tuning material.

14. The method of claim 13, wherein depositing the stress-tuning material further comprises depositing at least one of titanium, tungsten, TiW, chromium, or nickel-vanadium.

15. A method of forming a 3D IC, the method comprising:
receiving a silicon CMOS die comprising plurality of silicon MOSFETs on a first substrate comprising silicon;
receiving a high voltage die comprising a plurality of GaN-channeled high electron mobility transistors (HEMTs) on a GaN-On-Silicon (GOS) substrate having one or more single-crystalline III-N semiconductor material layers, wherein:
the GOS substrate includes a second substrate comprising silicon and of greater thickness than the first substrate; and
a stress-tuning metal is disposed on a back-side of the GOS substrate opposite the HEMTs; and
joining the silicon CMOS die to the high voltage die with a bump metal that makes contact to the stress-tuning metal.

16. The method of claim 15, wherein the first substrate has a thickness of at least 775 μm, and the second substrate has a thickness less than 100 μm.

* * * * *